United States Patent [19]

Balogh et al.

[11] Patent Number: 4,785,236
[45] Date of Patent: Nov. 15, 1988

[54] DEVICE FOR MEASURING VOLTAGE BY SCANNING

[75] Inventors: András Balogh; Lajos Bella; Gyula Somogyi, all of Budapest, Hungary

[73] Assignee: Miki Merestechnikai Fejleszto Vallalat, Budapest, Hungary

[21] Appl. No.: 931,820

[22] Filed: Nov. 18, 1986

[30] Foreign Application Priority Data

Nov. 18, 1985 [HU] Hungary .............................. 4375/85

[51] Int. Cl.⁴ ...................... G01R 19/26; G01R 17/06
[52] U.S. Cl. .................................. 324/120; 324/77 A; 324/99 D
[58] Field of Search ............. 324/120, 95, 79 R, 77 A, 324/99 D, 99 R, 123 R, 123 C

[56] References Cited

U.S. PATENT DOCUMENTS

| 3,412,331 | 11/1968 | Boatwright | 324/120 |
| 3,896,389 | 7/1975 | Basse | 324/120 |
| 4,313,212 | 1/1982 | Whitlock | 324/79 R |

FOREIGN PATENT DOCUMENTS

| 1293249 | 4/1969 | Fed. Rep. of Germany . |
| 1949056 | 4/1971 | Fed. Rep. of Germany . |
| 2078980 | 1/1982 | United Kingdom . |

Primary Examiner—Ernest F. Karlsen
Attorney, Agent, or Firm—Sughrue, Mion, Zinn, Macpeak & Seas

[57] ABSTRACT

Device for measuring voltage by sampling, including a voltage metering sampling means (2) driven by a pilot frequency generator (12), an amplifier (3) to amplify the sampled signal and a signal processing unit (6) to evaluate the amplified signal in accordance with the prescribed measuring task. The device, in accordance with the invention, contains an auxiliary oscillator (14) which produces an auxiliary signal, as well as an amplifier (3) with adjustable amplification, which is located between sampling unit (2) and signal processing unit (6), and a differential circuit (5). The auxiliary signal on one side, together with the voltage to be measured, is connected to signal input (17) of sampling unit (2), on the other side by means of a phase shifter (13) to an input (25) of differential circuit (5). A feedback branch (28), selective for the frequency of the auxiliary signal, is connected between, on one side, the output of differential circuit (5) and/or its other input (24) which is connected to adjustable amplifier (3) and, on the other side, the control input (21) of adjustable amplifier (3).

16 Claims, 3 Drawing Sheets

DEVICE FOR MEASURING VOLTAGE BY SCANNING

BACKGROUND OF THE INVENTION

The subject of the invention is a device for measuring voltages by sampling which can be used in particular by independent instruments using broad frequency ranges or by automatic testing equipment.

For high-frequency voltage meters the selected mode of operation generally determines and thereby restricts the range of applications of the measuring instruments. The number of systems that can be chosen is further restricted when automatic testing equipment are being used since for these instruments, which have an upper frequency limit of ghz magnitude, it is necessary to guarantee rapid operation, great precision, and proper temporal as well as thermal stability.

Two types of models are known for programmable high-frequency meters which can also be used in automatic testing equipment: One works with a detector and one in accordance with the principle of incoherent (stochastic) sampling. Theoretically about the same frequency range can be reached with these two types of instruments.

For instruments with a detector, the high-frequency signal to be measured arrives at the input to the detector circuit, constructed of diodes. The DC signal appearing at the output of the detector circuit is proportional for small input levels to the true effective value of the input signal because of the characteristics of the diodes; however, for large input levels it is proportional to the peak value of the input signal. The transmission characteristic of the detector circuit is non-linear, and transformation effectiveness rapidly decreases in the direction of small levels. The output signal of the detector circuit arrives, after appropriate amplification, at the input of a non-linear amplifier. The non-linear amplifier compensates for the non-linear detector circuit. The output signal of the non-linear amplifier can be connected to an instrument or, by an analog-digital converter, to a digital indicator or, for further processing, to a computer.

Using this principle for measuring has the following disadvantages:

the non-linear transmission characteristics of the detector must be linearized with a non-linear break point approximation circuit which requires a difficult adjustment which depends on the individual diodes;

in case of large and small input levels, the output signal of the detector circuit is always proportional to different parameters of the input signal (effective value, peak value); measurements of complex signals (e.g., noise) with variable level cannot, therefore be clearly evaluated;

when input levels are low, the transformation effectiveness decreases very rapidly because of the characteristics of the diodes; the instrument, consequently, becomes insensitive below an input level of about 200 mv and, as a result, the instrument cannot be readjusted; only an adjustment range can be indicated.

The operation of an instrument functioning in accordance with the principle of incoherent sampling occurs as follows: The high-frequency signal to be measured arrives at the input point of a sampler. For a very short time the sampler switches the signal to be measured, corresponding to the frequency of an voltage-controlled oscillator, to the input of an amplifier with constant amplification. The sampling may last some 100 psec; thus, the input capacity of the amplifier is loaded with proportional voltage over the entire frequency spectrum of the instrument with the instantaneous value of the signal to be measured while it is being discharged between two samples. The amplitude of the impulse sequence appearing at the output of the amplifier is, therefore, proportional to the instantaneous value of the signal to be measured at the moment of sampling. When the frequency of the sampling stochastically changed in relation to the signal to be measured which is to say that the sampling is incoherent and that a large number of sampled values of the signal to be measured can be obtained the statistical parameters of the sampled impulse sequence (peak, medium, and effective value) are the same as the corresponding values of the signal to be measured (principle of stochastic sampling). Stochastic sampling occurs in such a way that the frequency of the voltage-controlled oscillator controlling the sampling is frequency modulated by another oscillator.

The device in accordance with the principle of incoherent sampling has the following advantages over the detector type:

the transmission characteristic of the sampler is linear because the sampling switch is controlled by a constant-amplitude signal; the transformation effectiveness, consequently, is not a function of the amplitude of the signal to be measured;

the output signal of the sampler has the statistical parameters of the signal to be measured, regardless of input level; consequently when measuring complex signals (e.g., noise) the measurement can be precisely evaluated;

since the opening of a switch of the sampler is carried out by a signal that is independent of the signal to be measured, the transformation effectiveness of the sampler is independent of the amplitude of the signal to be measured; thus, the device can be precisely calibrated.

The disadvantage of a device which works in accordance with the principle incoherent sampling is that the transformation effectiveness of the sampler is significantly dependent on outside temperature, which has the apparent effect of a change in amplification. This value is approximately three to four times as high as the characteristic value for devices operating with diode detectors. This problem is solved by a known method in such a way that the device has a built-in calibration instrument at the output to which the measured signal input can be linked, and the device can thus be calibrated in accordance with the prevailing outside temperature. This calibration device is really a reference standard which makes it rather expensive. An additional disadvantage of this solution is that, when it is used in an automatic testing equipment, it obviously increases the duration of said sampling device's measurements significantly because of temporary disruption of the testing process.

SUMMARY OF THE INVENTION

The problem addressed by the present invention is while maintaining the advantages of device operating in accordance with the principle of incoherent sampling to find a temperature-independent way of sampling which, despite changes in temperature-dependent parameters of the component and circuit units used, assures uninterrupted measurements. The problem has been solved by the present invention by using an auxiliary signal wherein said auxiliary signal, without distorting the value of the voltage measured, assures a steady testing process. Thus, the present invention is a device for measuring voltage having a sampling unit for the voltage to be measured, an amplifier for amplifying the sampled signal, and a signal processing unit which evaluates the amplified signal in accordance with the prescribed measuring task, wherein the sampling unit is connected to a pilot frequency generator. The device, in accordance with the present invention, has an auxiliary oscillator producing an auxiliary signal, as well as an amplifier with adjustable amplification and a differential circuit between the sampling unit and the signal processing unit, whereby said auxiliary signal is linked, (1) together with the voltage to be measured to a signal input of the sampling unit and, (2) to an input of the differential circuit by means of a phase shifter. The auxiliary signal is further linked to a frequency selective feedback path which responds to the frequency of the auxiliary signal and which is connected between the output and/or another input of the differential circuit and the adjustable amplifier.

The auxiliary signal, in accordance with the invention, is always superimposed onto the voltage signal to be measured between the sampling unit and the differential circuit; however, after passing through the differential circuit it already has such a low value that it will not affect the voltage measurement. The feedback branch which is connected before and/or after the differential circuit and which responds to the frequency of the auxiliary signal can sense the auxiliary signal where necessary with corresponding amplification and, consequently, control the adjustable amplifier. If the feedback branch is connected before the differential circuit its amplification can be much smaller because the auxiliary signal to be sensed is much larger here. The solution of the invention does not require a highly stable auxiliary oscillator.

The feedback circuit can be appropriately designed so that it is connected to the output of the differential circuit, and it comprises an additional amplifier; a phase-sensitive rectifier, which is controlled by the output signal of the phase shifter; and a first low-pass filter all of which are connected in series.

The selectivity of the feedback branch can be further increased if the additional amplifier has a low-pass characteristic e.g., it is of integrating type.

The feedback branch, in another embodiment, is connected to said other input of the differential circuit and contains a phase-sensitive rectifier; a DC differential link; another amplifier; and a first low-pass filter, whereby an input of the DC differential member is linked, by inserting a rectifier, to the phase shifter. In this configuration the auxiliary signal sensed by the feedback branch is larger which makes for a better signal-to-noise ratio.

In another possible embodiment, the feedback branch is connected to the output and also to said other input of the differential circuit. In this case the feedback branch contains a first differential member which is connected by its two inputs to the output and to the other input of the differential circuit; a second differential member; an additional amplifier; a phase-sensitive rectifier; and a first low-pass filter which are connected in series wherein the input of the second differential member and the control input of the phase-sensitive rectifier are connected to the phase shifter. This configuration assures a good signal-to-noise ratio and also has the advantage that the differential circuit is inside the control loop.

In another embodiment suitable for metering high-frequency voltages, it is advantageous if the other input of the differential circuit is connected to the output of the adjustable amplifier by insertion of a sample and hold circuit with delayed sampling relative to the first sampling unit. It is appropriate if aside from regulating with said auxiliary signal the output of the sample and hold circuit is connected by way of a second low-pass filter to a feedback input of the sampling unit. This second negative feedback assures primarily DC stability of the sampling unit.

The solution of the invention is particularly appropriate for measurements of the stochastic type carried out with incoherent sampling. Here the generator controlling the sampling unit is a voltage-controlled oscillator whose control input is connected to a voltage source with a variable output signal. However, the invention can also be used for coherent or Shannon sampling. In this case the generator controlling the sampling unit is a unit which produces a signal that corresponds to the prevailing frequency of the voltage to be measured or, respectively, a signal of constant frequency.

In a configuration for incoherent sampling it is advantageous if the frequency of the auxiliary oscillator is smaller than the lower limit of the frequency range of the voltage to be measured. This will further increase the precision of the measurement.

An embodiment for measuring high-frequency voltage is particularly advantageous if the sampling unit contains an analog diode switching circuit whose signal input is connected on the one hand by a condenser to the input where the voltage to be measured is received, and on the other hand by resistors and a bushing type capacitor connected in series to the output of the auxiliary oscillator.

In the device of the invention, the signal processing unit should be chosen to correspond to the required measuring task. This may be a circuit for measuring the effective value, the peak value or the electrolytic mean value or a combination thereof with a switching capability. For executing complicated measuring tasks e.g., for a statistical analysis of the voltage signal to be measured the signal processing unit can be configured as an analog processing unit or, after analog-digital conversion, as a digital processing unit.

BRIEF DESCRIPTION OF THE DRAWINGS

The invention is further described in detail on the basis of the embodiments illustrated by the drawings, wherein like numbers designate like components and wherein.

DETAILED DESCRIPTION OF THE INVENTION

Figure 1:
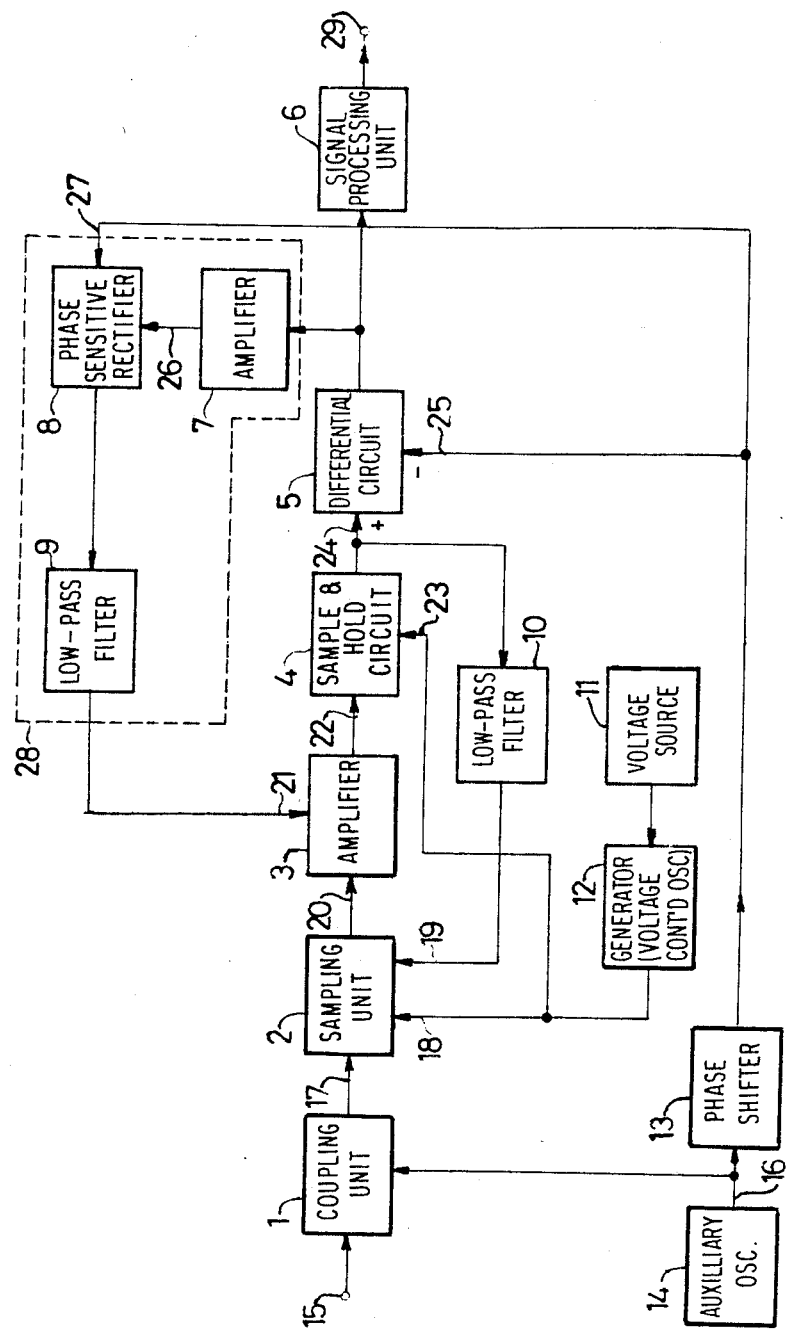
FIG. 1 is a block diagram of the invention.

In FIG. 1, the high-frequency signal to be measured passes from input 15 through a coupling unit 1 to signal input 17 of a sampling unit 2. An auxiliary oscillator 14 generates at its output 16 an auxiliary signal of an appropriately selected frequency, the frequency should preferably be outside the measuring range and lower than the sampling frequency, and the auxiliary signal is connected by way of the coupling unit 1 to the signal input 17 of sampling unit 2 simultaneously with the signal to be measured. The function of coupling unit 1 is to apply the voltage signal to be measured and the auxiliary signal to signal input 17 of sampling unit 2. The sampled value at output 20 of sampling unit 2 is proportional to the sum of the instantaneous values of the signal to be measured and the auxiliary signal obtained at the moment of sampling. Sampling unit 2 is opened by way of its control input 18 by a generator 12, in the configuration shown by a voltage-controlled oscillator, the output frequency of said oscillator being modulated by a voltage source 11 with a variable output signal, e.g., by a saw-tooth voltage generator or sine wave oscillator.

Sampling unit 2 in its switched-on condition places the signal arriving at its signal input 17 at its output 20 and thereby at the input of amplifier 3 with adjustable amplification. The storage capacity of sampling unit 2 (see condenser 43 of FIG. 4) is loaded to a voltage which is proportional to the sum of the recorded value of the signal to be measured at the moment of sampling and of the auxiliary signal. This capacity loses its charge between two samplings, which means that condenser 43 discharges itself. The output signal of adjustable amplifier 3 is connected to input 22 of sample and hold circuit 4. Sample and hold circuit 4 samples the signal produced by sampling unit 2 and amplified by amplifier 3, it thereby only carries out a signal formation (amplification) but does not affect the statistically characteristic value of the sampled signal. Sample and hold circuit 4 should be controlled in synchronism with sampling unit 2 and in such a way that the signal appearing at the output of sampling unit 2 or, respectively, at the corresponding output of amplifier 3 is to be sampled at maximum value. This requires a constant time delay. Sample and hold circuit 4 is controlled by way of its control input 23 by the correspondingly delayed output signal of generator 12. The output signal of sample and hold circuit 4 arrives, on one side, by way of a low-pass filter 10 as a direct current feedback at feedback input 19 of sampling unit 2 and, on the other hand, it is supplied to an input 24 of differential circuit 5. The signal of the auxiliary oscillator 14 is connected to another input 25 of differential circuit 5 by way of phase shifter 13. Since the auxiliary signal of auxiliary oscillator 14 experiences a phase delay when it passes from the input of coupling unit 1 to input 24 of differential circuit 5, it is the function of phase shifter 13 to assure that the signals arriving at inputs 24 and 25 of differential circuit 5 with the frequency of auxiliary oscillator 14 are in phase. In the case when the amplitude and the phase of the signal arriving at input 25 of differential circuit 5 agree with the amplitude and phase of the signal of auxiliary oscillator 14 which is added to the signal measured, the differential signal of the frequency of auxiliary oscillator 14 practically, in comparison to the signal to be measured, negligible at the output of differential circuit 5. In case no signal of the frequency of auxiliary oscillator 14 is found at the input 24 to differential circuit 5 the amplitude of which corresponds to the amplitude of the signal of auxiliary oscillator 14 connected to input 25, an in-phase or an opposite phase differential signal with the frequency of auxiliary oscillator 14 is formed, depending on the direction of the deviation, at the output of differential circuit 5.

The output of differential circuit 5 is connected through an amplifier 7 having a low-pass filter characteristics e.g. an integrating model to input 26 of phase-sensitive rectifier 8. The output signal of phase shifter 13 is coupled to control input 27 of phase-sensitive rectifier 8. It is the function of the integrating amplifier 7, to amplify the differential signal, with the frequency of auxiliary oscillator 14, after having integrated the sampled signal. The output of phase-sensitive rectifier 8, is connected to a control input of the adjustable amplifier 3 through a low-pass filter 9. The amplifier, the phase-sensitive rectifier 8 and the low-pass filter 9 form a feedback circuit 28. Phase-sensitive rectifier 8, with its great selectivity, creates excellent, controlled direct current out of the in-phase differential signal which changes the gain of the amplifier 3 to such a degree that the signals at inputs 24 and 25 of differential circuit 5, which have the frequency of auxiliary oscillator 14, should have the same amplitudes.

By increasing the gain of integrating type amplifier 7, the differential signal with the frequency of auxiliary oscillator 14 decreases at the output of differential circuit 5 which makes it possible to hold if the selected gain is set correspondingly high the measurable signal at the output of differential circuit 5, with the frequency of auxiliary oscillator 14, at a predetermined minimum in comparison to the signal to be measured; thus it does not cause an error during the measurement. This configuration is advantageous because differential circuit 5 can be used simultaneously as a differential-building element of the feedback loop and because differential circuit 5 is within the control loop.

Figure 2:
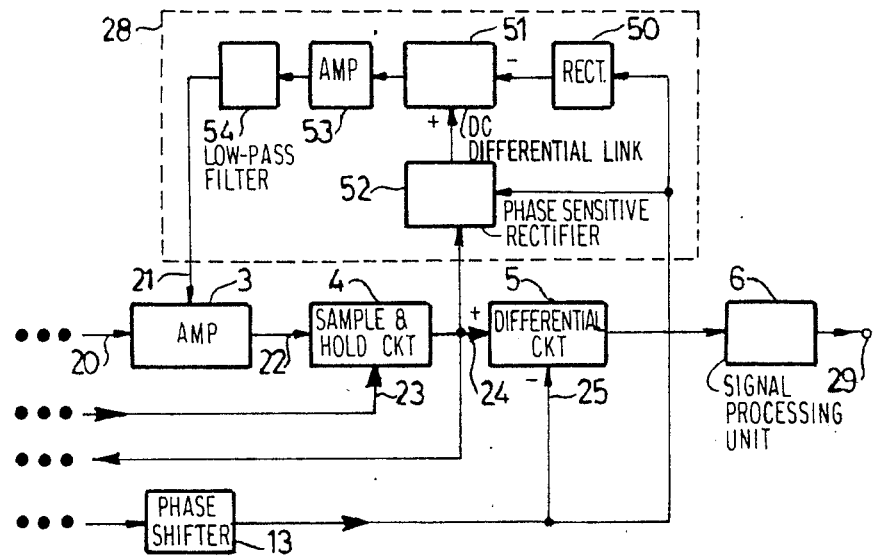
FIGS. 2 and 3 are block diagrams of additional advantageous embodiments of the feedback branch of the device in accordance with FIG. 1.

In accordance with FIG. 2, feedback branch 28, as distinct from FIG. 1, can be designed in such a way that it is inserted between input 24 of differential circuit 5 and control input 21. In this case, different-building should also occur in feedback branch 28, since differential circuit 5 is not now within the control loop. A phase-sensitive rectifier 52 is directly connected to the output of sample and hold circuit 4. The filtered output of said rectifier 52 leads to an input of a direct current differential element 51 whose other input is fed by the filtered signal of rectifier 50 which is connected to the output of phase shifter 13. The output of direct current differential element 51 connects via an amplifier 53, which adjusts loop gain, and a low-pass filter 54, which is required for stability, to control input 21. In this configuration, the auxiliary signal can be received with a higher amplitude for feedback; and the signal-to-noise ratio is consequently better.

Figure 3:
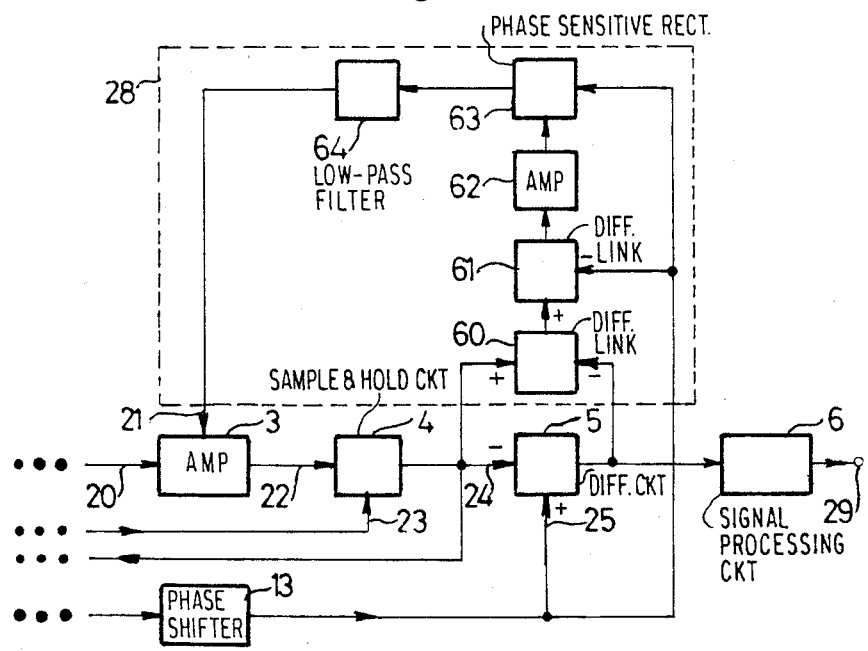

In accordance with FIG. 3 feedback branch 28 connects, as distinct from FIG. 1, to the output as well as to input 24 of differential circuit 5 by way of inputs of differential link 60 at the output of which appears the auxiliary signal at input 24 combined with the signal to be measured. The output of differential link 60 arrives at one input of differential link 61 which performs the difference-building function of the feedback circuit, the other input of which is connected to the output of phase shifter 13. The output signal of differential element 61 arrives, by way of an amplifier 62, at the phase-sensitive rectifier 63 which is also controlled by the output signal of phase shifter 13. The output signal of phase-sensitive rectifier 63 is applied, by way of low-pass filter 64 which is required for stability to control input 21. The advantage of this configuration is its high signal-to-noise ratio and the fact that differential circuit 5 is also inside the control loop.

In the device in accordance with the invention a control loop is found—which because it guarantees temperature independent amplification for the auxiliary signal of the auxiliary oscillator 14—automatically assures the same for the signal to be measured.

There is also a signal processing unit 6 which is connected to the output of differential circuit 5. An impulse series, which only carries the statistical parameters of the signal to be measured and wherein the effect of the signal with the frequency of auxiliary oscillator 14 can be neglected, arrives at signal processing unit 6. Signal processing unit 6 creates, at its output 29, from the sampled impulse series, a signal which is proportional to its peak value, electrolytic mean value and/or effective value and this signal is proportional to the corresponding value of the signal to be measured and calibrated in accordance with the corresponding value of the signal to be measured. The signal at output 29 can be transmitted for further processing to a computer by way of a (not shown) analog-digital converter. Signal processing unit 6 can be a complicated circuit which determines a statistical parameter (e.g., distribution of amplitudes) or also several parameters; it can be constructed either with analog or digital circuits.

Figure 4:
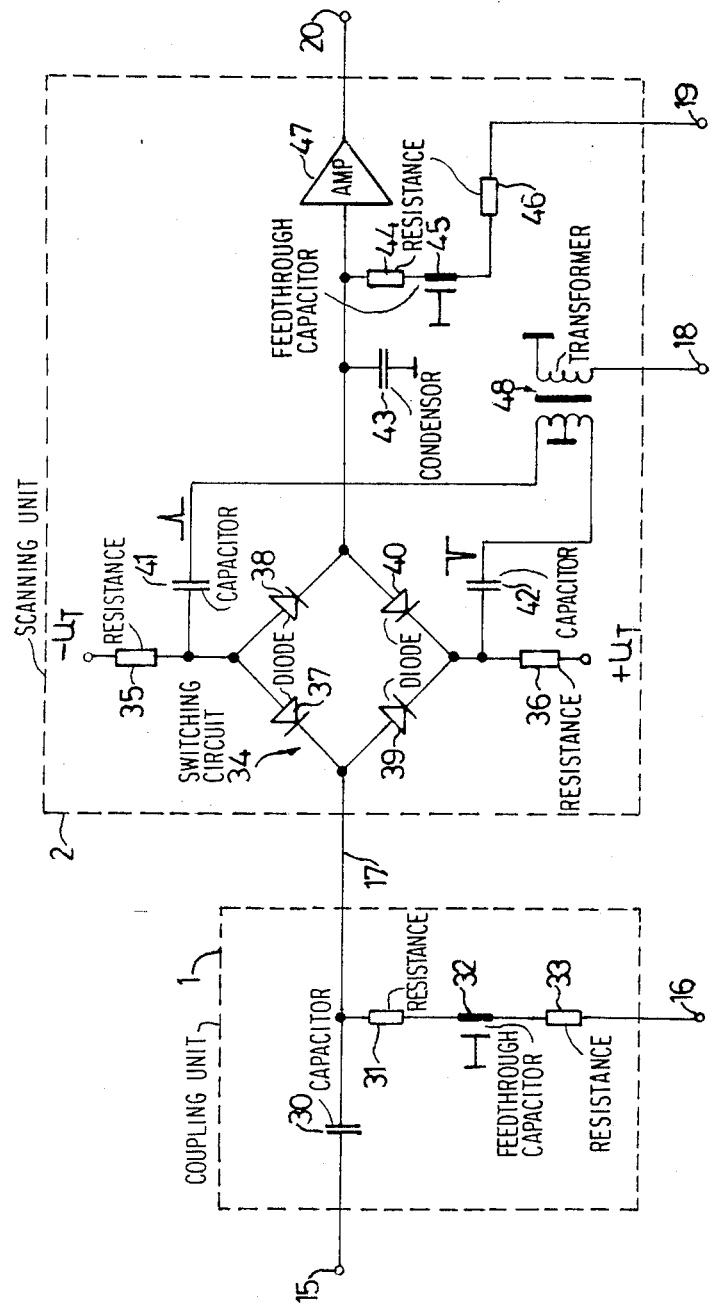
FIG. 4 is a detailed circuit diagram of the coupling unit and the sampling unit of the device of the invention in accordance with FIG. 1.

FIG. 4 represents an embodiment of coupling unit 1 and sampling unit 2 in accordance with FIG. 1 which is also suitable for a millivoltmeter which operates in a broader frequency range.

The voltage signal to be measured arrives from input 15 by way of a condenser 30 at signal input 17 of sampling unit 2. The sine or rectangular-shaped auxiliary signal of e.g. 1 khz, located at output 16 of auxiliary oscillator 14 is connected by way of a resistance 33, a feed-through capacitor 32 and another resistance 31 to input 17. Coupling unit 1 thus adds the two signals and simultaneously assures through feed-through capacitor 32 that the high-frequency signal to be measured (e.g., 100 khz—1 ghz) cannot reach output 16.

Input 17 connects by way of an analog diode switching circuit 34 to the input of amplifier 47 while the output of amplifier 47 produces output 20 of sampling unit 2. Diode switching circuit 34 contains four diodes 37, 38, 39 and 40 connected in a bridge, which are connected by resistors 35 and 36 between supply voltages $-U_T$ and $+U_T$. The points of the diode bridge circuit which connect to resistors 35 and 36 are fed through capacitors 41 and 42 by the secondary coils of an impulse transformer 48 by positive or negative impulses synchronous to one another, corresponding to variable control, e.g., in the range of 100-150 khz, which is received by way of control input 18 from generator 12 by the primary coil and which determines the lower frequency limit of the measuring range. The peak value of the positive and negative impulses is larger than the supply voltage $U_T$, consequently, the diode switching circuit 34 is kept open during the time that the momentary value of the impulse exceeds the supply voltage $U_T$.

This time period is about 0.1-0.3 ns with an upper limit of the frequency of the measuring range of about 1 ghz.

Between the output of diode switching circuit 34 and ground is inserted a condenser 43 which stores the sampled signal. This point, which is also the input of amplifier 47, is connected by means of a resistor 44 a feed-through capacitor 45 and a resistor 46 to feedback input 19 which is connected to the output of low-pass filter 10. At the input of amplifier 47 are thus accumulated, on the one hand, the sampled summed signal of the signal to be measured and the auxiliary signal; and on the other hand, the feedback signal. A signal corresponding to this accumulated signal appears at the output of amplifier 47 which is output 20 of sampling unit 2.

The device of the invention with a corresponding unit for transforming current to voltage is also suitable for measuring the current. This unit in the simplest case is a resistor; however, it can also contain, for instance, an electric current transformer when a ground-independent measurement is required. The device of the invention cannot only be designed for single channel measurement but also for a two-channel measurement; for instance, one channel for measuring voltage and the other for measuring the corresponding electric current, and in this context signal processing unit 6 can produce a signal which corresponds to the value of the complex impedance.

A significant advantage of the invention is the fact that no special thermal stability is required for amplitude of the output signal of auxiliary oscillator 14. Differential circuit 5 creates the difference for the signals coming from the same auxiliary oscillator 14 so that the change in amplitude of auxiliary oscillator 14 does not cause an error. The thermal stability of the system is only affected by a change of the parameters of phase shifter 13 or by a significant change in the frequency of auxiliary oscillator 14. The thermal stability of the parameters of phase shifter 13, and also that the frequency of auxiliary oscillator 14, can easily be provided by an appropriate selection of the type of passive R, L and C elements used.

Another advantage of the solution is the fact that a significant improvement in the specification has been achieved with a set of low frequency elements, the cost of which can be negligible in view of the cost of the materials for the complete system, and the fact that it has the further advantage of not requiring a calibration unit to be built into the device nor the use of a costly correcting amplifier, variable as a function of temperature, inside signal processing unit 6.

The device of the invention corresponds in every regard to the special requirements of programmable devices which can be used for automatic testing equipment and which measure analog parameters. When used as a separate device in the laboratory, it has at its disposal better technical specification than similar devices existing in this category.

What is claimed is:

1. A device for measuring an input signal, comprising:
   auxiliary oscillator means for producing an auxiliary signal;
   means for combining said auxiliary signal and said input signal to obtain a combined signal;
   sampling means for sampling said combined signal;
   first means for amplifying said sampled signal with an amplification adjustable in accordance with an amplification control signal to obtain an amplified signal;
   phase shifting means receiving and phase shifting said auxiliary signal;
   a differential circuit means for differentially combining said amplified signal and the phase-shifted auxiliary signal to obtain a difference signal;
   feedback means for generating said amplification control signal in accordance with an auxiliary signal component of at least one of said amplified signal and said difference signal; and signal processing means for evaluating said difference signal in accordance with the measurement to be made.

2. A device in accordance with claim 1, wherein said feedback means comprises feedback circuit means (8) receiving as inputs said difference signal and said phase-shifted auxiliary signal and generating said amplification control signal in accordance with said auxiliary signal component of said difference signal.

3. A device in accordance with claim 1, wherein said feedback means comprises feedback circuit means (50, 51, 52) for receiving as inputs said amplified signal and said phase-shifted auxiliary signal and generating said amplification control signal in accordance with a difference between said phase-shifted auxiliary signal and said auxiliary signal component of said amplified signal.

4. A device in accordance with claim 1, wherein said feedback means comprises first feedback circuit means (60) for receiving as inputs said amplified signal and difference signal and generating a first differential signal therefrom, second feedback circuit means (61) for receiving said first differential signal and said phase-shifted auxiliary signal and for generating a second differential signal therefrom, and third feedback circuit means (63) for generating said amplification control signal in accordance with an auxiliary signal component of said second differential signal.

5. A device in accordance with claim 1, wherein said feedback means comprises an additional amplifier for receiving and amplifying the output of said differential circuit means, a phase-sensitive rectifier receiving an output of said additional amplifier and controlled in accordance with the output of said phase-shifting means, and a first low-pass filter receiving the output of said phase-sensitive rectifier and providing said amplification control signal.

6. A device in accordance with claim 5, wherein said additional amplifier exhibits a low-pass characteristic.

7. A device in accordance with claim 3, wherein said feedback circuit means comprises a phase-sensitive rectifier receiving and rectifying said amplified signal, a direct current differential means receiving as inputs the output of said phase-shifting means through a rectifier, and the output of said phase-sensitive rectifier, an additional amplifier coupled to the output of said direct current differential means, and a first low-pass filter receiving the output of said additional amplifier and providing said amplification control signal.

8. A device as claimed in claim 1, wherein the input to said feedback means comprises both said amplified signal and said difference signal, and wherein said feedback means comprises:
a first differential means receiving as inputs said amplified signal and said difference signal;
a second differential means receiving as inputs the output of said first differential means and the output of said phase-shifting means;
feedback amplifying means receiving and amplifying the output of said second differential means;
a phase-sensitive rectifier receiving as inputs the output of said feedback amplifying means and the output of said phase-shifting means; and
a first low-pass filter receiving and filtering the output of said phase-sensitive rectifier and providing said amplification control signal.

9. A device as claimed in claim 1, further comprising sample and hold circuit means receiving as an input the output of said first amplifying means and providing its output to the input of said differential circuit means, said sample and hold circuit means sampling its input at a delay with respect to said sampling means.

10. A device as claimed in claim 9, further comprising a second low-pass filter receiving and filtering said output of said sample and hold circuit means and having its output connected to a feedback input of said sampling means.

11. A device as claimed in claim 1, further comprising:
a voltage controlled oscillator for generating a signal for controlling said sampling means in accordance with a control voltage; and
a voltage source for providing a variable control voltage to said voltage controlled oscillator.

12. A device as claimed in claim 1, wherein the frequency of said auxiliary oscillator means is lower than the lower limit of the frequency range of said input signal.

13. A device as claimed in claim 1, wherein said sampling means comprises an electric analog diode switching means which receives the output of said combining means as its input.

14. A device as claimed in claim 13, wherein said combining means further comprises:
a first capacitor for passing said input signal to the input of said diode switching means; and
a series connection of a first resistor, a feedthrough capacitor and a second resistor for passing said auxiliary signal to the input of said diode switching means.

15. A device as claimed in claim 1, wherein said signal processing means comprises an electric circuit for measuring at least one of the RMS value, the peak value and the electrolytic mean value.

16. A device as claimed in claim 1, wherein said signal processing means comprises circuit means for determining at least one characteristic statistical value of the signal arriving at its input.

* * * * *